United States Patent
Bonifield

(10) Patent No.: US 12,489,088 B2
(45) Date of Patent: Dec. 2, 2025

(54) IC PACKAGE WITH MULTIPLE DIES

(71) Applicant: TEXAS INSTRUMENTS INCORPORATED, Dallas, TX (US)

(72) Inventor: Thomas Dyer Bonifield, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/186,608

(22) Filed: Mar. 20, 2023

(65) Prior Publication Data

US 2023/0230961 A1 Jul. 20, 2023

Related U.S. Application Data

(62) Division of application No. 16/897,996, filed on Jun. 10, 2020, now Pat. No. 11,616,048.

(Continued)

(51) Int. Cl.
*H01L 25/065* (2023.01)
*H01L 21/56* (2006.01)
(Continued)

(52) U.S. Cl.
CPC .......... *H01L 25/0657* (2013.01); *H01L 21/56* (2013.01); *H01L 21/78* (2013.01); *H01L 23/3157* (2013.01); *H01L 23/58* (2013.01); *H01L 24/05* (2013.01); *H01L 24/32* (2013.01); *H01L 24/48* (2013.01); *H01L 24/73* (2013.01); *H01L 24/83* (2013.01); *H01L 24/92* (2013.01); *H01L 2224/04042* (2013.01); *H01L 2224/05571* (2013.01); *H01L 2224/32145* (2013.01); *H01L 2224/73265* (2013.01); *H01L 2224/92247* (2013.01); *H01L 2225/0651* (2013.01); *H01L 2225/06531* (2013.01); *H01L 2225/06568* (2013.01); *H01L 2924/30105* (2013.01)

(58) Field of Classification Search
CPC ............................................ H01L 2225/06531
See application file for complete search history.

(56) References Cited

U.S. PATENT DOCUMENTS 7,288,940 B2   10/2007   Wynne et al.
8,890,223 B1   11/2014   Bonifield et al.
(Continued)

FOREIGN PATENT DOCUMENTS

CN   101102962 A   1/2008
CN   103107099 A   5/2013
(Continued)

*Primary Examiner* — Yu-Hsi D Sun
(74) *Attorney, Agent, or Firm* — Yudong Kim; Frank D. Cimino

(57) ABSTRACT

An integrated circuit (IC) package includes a first die with a first surface overlaying a substrate. The first die includes a first metal pad at a second surface opposing the first surface. The IC package also includes a dielectric layer having a first surface contacting the second surface of the first die. The IC package further includes a second die with a surface that contacts a second surface of the dielectric layer. The second die includes a second metal pad aligned with the first metal pad of the first die. A plane perpendicular to the second surface of the first die intersects the first metal pad and the second metal pad.

20 Claims, 8 Drawing Sheets

Related U.S. Application Data

(60) Provisional application No. 62/860,593, filed on Jun. 12, 2019.

(51) Int. Cl.
  *H01L 21/78* (2006.01)
  *H01L 23/00* (2006.01)
  *H01L 23/31* (2006.01)
  *H01L 23/58* (2006.01)

(56) References Cited

U.S. PATENT DOCUMENTS

| | | |
|---|---|---|
| 9,318,274 B2 | 4/2016 | Wang |
| 10,498,396 B1 | 12/2019 | Frey et al. |
| 10,523,175 B2 | 12/2019 | Sankaran et al. |
| 2008/0224306 A1 | 9/2008 | Yang |
| 2014/0347786 A1 | 11/2014 | Wang |
| 2015/0130022 A1* | 5/2015 | Watanabe ............... H01L 23/62 257/531 |
| 2015/0216053 A1 | 7/2015 | Sauer |
| 2018/0175741 A1 | 6/2018 | Andersen et al. |
| 2019/0088576 A1 | 3/2019 | Higgins, III et al. |
| 2019/0131682 A1 | 5/2019 | Cook et al. |
| 2019/0181769 A1 | 6/2019 | Oljaca et al. |

FOREIGN PATENT DOCUMENTS

| | | |
|---|---|---|
| CN | 104637918 A | 5/2015 |
| CN | 107743654 A | 2/2018 |
| CN | 110798240 A | 2/2020 |
| JP | H09504908 A | 5/1997 |
| JP | 2006253330 A | 9/2006 |
| JP | 2015095469 A | 5/2015 |
| WO | 2019089775 | 5/2019 |

* cited by examiner

IC PACKAGE WITH MULTIPLE DIES

CROSS-REFERENCE TO RELATED APPLICATION

This application is a Division of U.S. patent application Ser. No. 16/897,996, entitled "IC PACKAGE WITH MULTIPLE DIES," filed Jun. 10, 2020, the entirety of which is hereby incorporated herein by reference, which claims the benefit of U.S. Provisional Patent Application No. 62/860,593, entitled "Face-to-Face Stacked Die High Voltage Isolation Capacitor," filed on 12 Jun. 2019.

TECHNICAL FIELD

This disclosure relates to integrated circuit (IC) packages, and more particularly, to an IC package with multiple dies.

BACKGROUND

Galvanic isolation is a principle of isolating functional sections of electrical systems to prevent current flow, such that a direct conduction path is not permitted. Energy or information can still be exchanged between the sections by other mechanisms, such as capacitance, induction or electromagnetic waves. Galvanic isolation is used where two or more electric circuits communicate, but each such electric circuit have grounds that may be at different potentials. Galvanic isolation is an effective method of breaking ground loops by preventing unwanted current from flowing between two units sharing a ground conductor. Galvanic isolation is also used for safety, preventing accidental current from reaching ground through a person's body.

Capacitors can provide galvanic isolation by allowing alternating current (AC) to flow, but blocking direct current. Accordingly, capacitors can couple AC signals between circuits at different direct voltages.

SUMMARY

A first example relates to an integrated circuit (IC) package that includes a first die with a first surface overlaying a substrate. The first die includes a first metal pad at a second surface opposing the first surface and a dielectric layer having a first surface contacting the second surface of the first die. The IC package also includes a second die with a surface that contacts a second surface of the dielectric layer. The second die includes a second metal pad aligned with the first metal pad of the first die. A plane perpendicular to the second surface of the first die intersects the first metal pad and the second metal pad.

A second example relates to an IC package. The IC package includes a first die with a first surface overlaying a first substrate, wherein the first die includes a first metal pad at a second surface opposing the first surface. The IC package also includes a second die comprising a second metal pad aligned with the first metal pad. A first protective overcoat layer contacts the second surface of the first die. The first protective overcoat layer includes a first recess that exposes a third metal pad positioned at the second surface of the first die. A second protective overcoat layer contacts a first surface of the second die. A non-conductive die adhesive (NCDA) layer is sandwiched between the first protective overcoat and the second protective overcoat. The NCDA layer overlays a portion of the first protective overcoat layer that is spaced apart from the first recess. The first metal pad and the second metal pad form a capacitor that couples the first die with the second die. The IC package further includes a second substrate that contacts a second surface of the second die. A second recess that extends through the second substrate and an insulating layer of the second die exposes a portion of a metal layer to provide a fourth metal pad.

A third example relates to a method for forming an IC package. The method includes applying a protective overcoat to a first die wafer that includes a first die and a second die wafer that includes a second die. A first surface of the first die overlays a substrate and a second surface of the first die includes a first metal pad. The second surface of the first die opposes the first surface of the first die. The method includes singulating the first die from the first die wafer and the second die from the second die wafer. The method also includes applying an NCDA layer to the second surface of the first die and aligning a second metal pad positioned on a surface of the second die with the first metal pad of the first die. The method further includes adhering the second die to the NCDA layer to form a capacitor with the first metal pad and the second metal pad. The capacitor couples the first die with the second die.

DETAILED DESCRIPTION

This disclosure relates to an integrated circuit (IC) package with a first die and a second die that are galvanically isolated and capacitively coupled. The first die and the second die include embedded circuits. Moreover, because the first and second dies are galvanically isolated, the circuits embedded in the first die may have a ground at a different potential than a ground of the circuits embedded in the second die. The first die has a first surface that overlays a first substrate, and the first die has a first metal pad at a second surface opposing the first surface. A first protective overcoat contacts the second surface of the first die. The second die has a first surface that contacts a second protective overcoat. The second die includes a second metal pad aligned with the first metal pad. The first metal pad and the second metal pad form nodes of a capacitor that couples the first die with the second die.

A non-conductive die adhesive (NCDA) layer is sandwiched between the first protective overcoat and the second protective overcoat. In some examples, multiple NCDA layers and/or a spacer are sandwiched between the first protective overcoat and the second protective overcoat. The combination of the first protective overcoat, the second protective overcoat, the NCDA layer (and/or other layers) intervening between the first metal pad of the first die and the second metal pad of the second die form a dielectric layer. The first metal pad of the first die and the second metal pad of the second die are separated by the dielectric layer, thereby forming the capacitor to capacitively couple the first die to the second die.

Additionally, wire bonds are employable to couple the first die and the second die to other components, such as other dies and/or external leads of the IC package. More particularly, a first recess in the first protective overcoat exposes a third metal contact positioned on the second surface of the first die. Similarly, a second substrate (e.g., formed of silicon) contacts a second surface of the second die. The second substrate includes a second recess that exposes a fourth metal pad positioned at the second surface of the second die. Wire bonds are coupled to the respective third and fourth metal pads to couple the first die and the second die to the other components of the IC package.

By implementing an IC package in this manner, electrical isolation, including functional isolation, basic isolation or reinforced isolation is achievable. Additionally, because the first die and the second die are galvanically isolated, different processing techniques are employable to fabricate the first die and the second die, particularly in situations where a maximum voltage of the first die is different than a maximum voltage of the second die.

Figure 1:
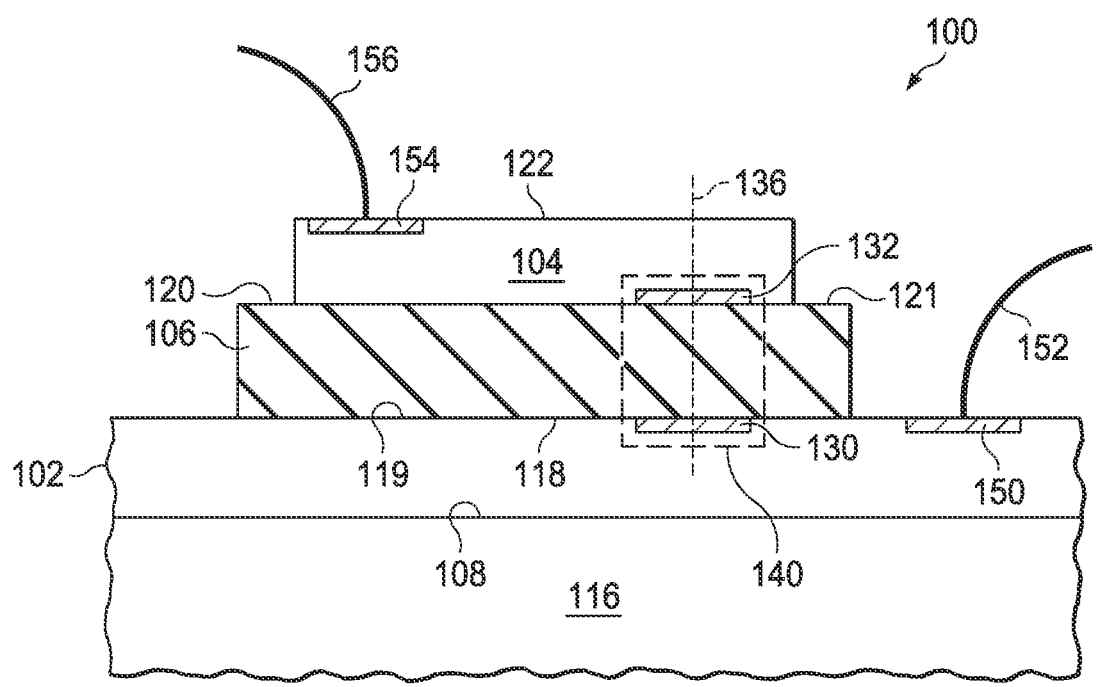
FIG. 1 illustrates a diagram of an example of an integrated circuit (IC) package with a first die and a second die that are galvanically isolated.

FIG. 1 illustrates a diagram of an example of an IC package 100 in a condition for completing packaging. The IC package 100 includes a first die 102 and a second die 104. The first die 102 and the second die 104 include respective embedded circuits. In one orientation, the second die 104 superposes the first die 102, and the first die 102 and the second die 104 are separated by a dielectric layer 106.

A first surface 108 of the first die 102 overlays a substrate 116. The substrate 116 can be formed of silicon. A second surface 118 of the first die 102 opposes the first surface 108. In some examples, the second surface 118 of the first die 102 is referred to as a face of the first die 102. In one orientation, the second surface 118 of the first die 102 underlies the dielectric layer 106, such that a first surface 119 of the dielectric layer 106 contacts the second surface of the first die 102.

The second die 104 includes a first surface 120 and a second surface 122. The second surface 122 of the second die 104 opposes the first surface 120 of the second die 104. In some examples, the second die 104 has a smaller footprint than the first die 102. The footprint of a die refers to an area of a surface of a respective die. In some examples, the first surface 120 of the second die 104 contacts a second surface 121 of the dielectric layer 106. The second surface 121 of the dielectric layer 106 opposes the first surface 119 of the dielectric layer 106.

In some examples, the dielectric layer 106 is implemented with a protective overcoat for the first die and the second die, as well as a single layer of homogenous material, such as a non-conductive die adhesive (NCDA) layer, such as a layer formed of an epoxy. In other examples, the dielectric layer 106 can be implemented with multiple layers of heterogenous material, such as the protective overcoat for the first die and the second die, multiple layers of an NCDA and a spacer interposed between the multiple layers of the NCDA.

The first die 102 and the second die 104 include embedded circuits. The first die 102 and the second die 104 can be formed with different materials and/or processing techniques. In this manner, the materials and/or processing techniques for fabricating the first die 102 and the second die 104 are individually selectable based on the operating parameters (e.g., maximum voltage) of the first die 102 and the second die 104.

In some examples, the arrangement of the first die 102 and the second die 104 is referred to as a face-to-face configuration. The first die 102 includes a first metal pad 130 (e.g., a connector) and the second die 104 includes a second metal pad 132. The first metal pad 130 and the second metal pad 132 are congruent and aligned. Accordingly, in one orientation, a plane, such as the plane 136 that extends perpendicular to the second surface 118 of the first die 102 intersects the first metal pad 130 and the second metal pad 132. The first metal pad 130 forms a first node of a capacitor 140 and the second metal pad 132 forms a second node of the capacitor 140.

The first die 102 and the second die 104 are galvanically isolated and capacitively coupled through the capacitor 140. In this manner, circuits embedded in the first die 102 communicate with circuits embedded in the second die 104 through the capacitor 140. Because the first die 102 and the second die 104 are galvanically isolated, in some examples, the first die 102 and the second die 104 have grounds at different potentials. In one example of a high voltage application, the ground of the first die 102 has a high voltage difference from the ground of the second die 104 (e.g., a voltage difference of about 40 volts (V) or more). In fact, in some examples, such as situations where the first die 102 includes circuits for driving a motor and the second die 104 controls the operations on the first die 102, the ground voltage of the first die 102 may be 1 kilovolt (kV) or more greater than the ground voltage of the second die 104.

The first die 102 includes a third metal pad 150 positioned on the second surface 118 of the first die 102. A first wire bond 152 is coupled to the third metal pad 150. Moreover, a fourth metal pad 154 is positioned on the second surface 122 of the second die 104. A second wire bond 156 is coupled to the fourth metal pad 154. The first wire bond 152 and the second wire bond 156 are coupled to other components of the IC package, such as other dies and/or the leads of the IC package.

The IC package 100 provides a simple design that achieves galvanic isolation. Moreover, in some examples, the IC package 100 achieves basic isolation, and in other examples, the IC package 100 achieves reinforced isolation. Additionally, as noted, the first die 102 and the second die 104 embed circuits that have different ground potentials. The wafer materials and processing techniques selected for the particular voltage range and/or other operational parameters of the first die 102 and the second die 104 are employable. In contrast, in situations where the circuits of the first die 102 and the second die 104 are integrated on a particular technology which provides the isolation, a designer would be limited to using that single particular type of materials and processing techniques.

Figure 2:
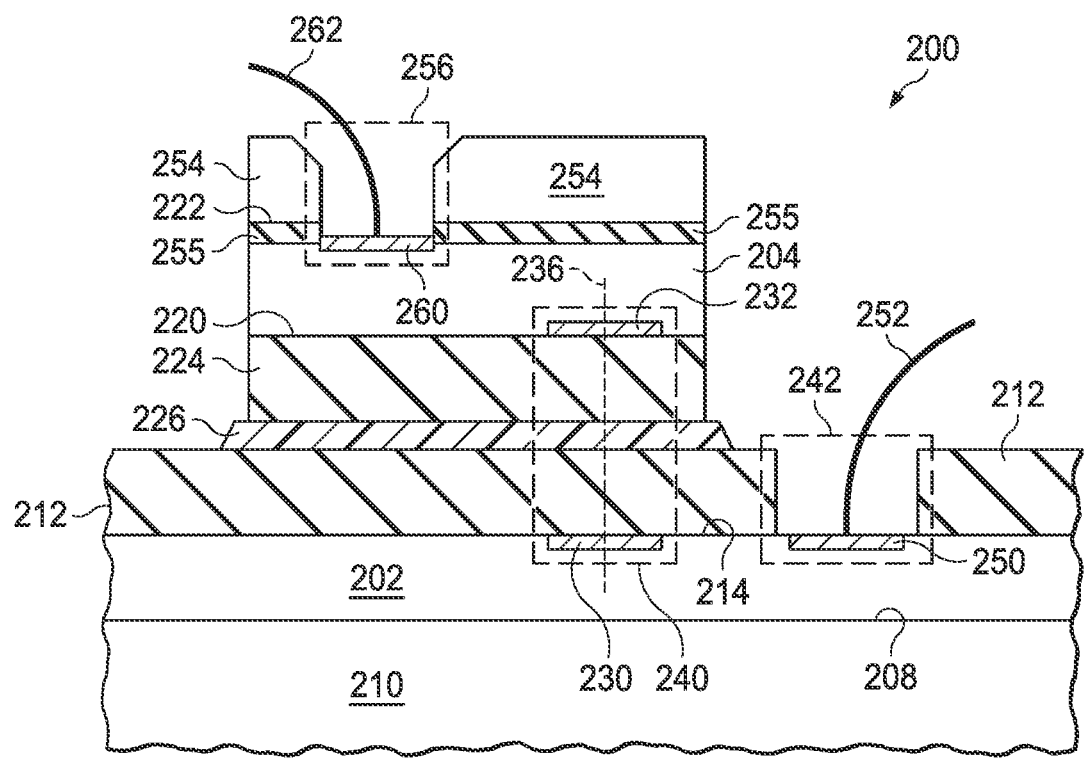
FIG. 2 illustrates another example of an IC package with a first die and a second die that are galvanically isolated.

FIG. 2 illustrates a detailed diagram of an example of an IC package 200 in a condition for completing packaging. The IC package 200 can be employed to implement the IC package 100 of FIG. 1. The IC package 200 includes a first die 202 and a second die 204 that are galvanically isolated.

A first surface 208 of the first die 202 overlays a first substrate 210. The first substrate 210 can be formed of silicon. A first protective overcoat 212 is applied to a second surface 214 of the first die 202, and the second surface 214 opposes the first surface 208. In some examples, the second surface 214 of the first die 202 is referred to as a face of the first die 202.

The second die 204 includes a first surface 220 and a second surface 222. The second surface 222 of the second die 204 opposes the first surface 220 of the second die 204. The first surface 220 of the second die 204 is referred to as a face of the second die 204. In some examples, the second die 204 has a smaller footprint than the first die 202. A second protective overcoat 224 is adhered to the first surface 220 of the second die 204.

The first die 202 and the second die 204 include embedded circuits. The first die 202 and the second die 204 can be formed with different materials and/or processing techniques. In this manner, the materials and/or processing techniques for fabricating the first die 202 and the second die 204 are individually selectable based on the operating parameters of the first die 202 and the second die 204.

An NCDA layer 226 is adhered to the first protective overcoat 212 and the second protective overcoat 224. Stated differently, the NCDA layer 226 is sandwiched between the first protective overcoat 212 and the second protective overcoat 224. In some examples, the NCDA layer 226 is implemented with an epoxy.

In some examples, the arrangement of the first die 202 and the second die 204 is referred to as a face-to-face configuration. The first die 202 includes a first metal pad 230 (e.g., a connector) and the second die 204 includes a second metal pad 232. The first metal pad 230 and the second metal pad 232 can each have a diameter ranging from 40 to 200 micrometers (μm). The first metal pad 230 and the second metal pad 232 are congruent and aligned, within manufacture tolerances (e.g., ±10 μm). Accordingly, in one orientation, a plane, such as the plane 236 that extends perpendicular to the second surface 214 of the first die 202 intersects the first metal pad 230 and the second metal pad 232. The first metal pad 230 forms a first node of a capacitor 240 and the second metal pad 232 forms a second node of the capacitor 240.

The first protective overcoat 212 and the second protective overcoat 224 can each be formed of a stack of materials. For example, the first protective overcoat 212 and the second protective overcoat 224 can be formed with a first layer of silicon dioxide ($SiO_2$) that is at least about 1 μm (e.g., ±0.7 μm) thick, a second layer of silicon oxynitride (SiON) that is at least about 1 μm (e.g., ±0.7 μm) thick and a third layer of silicon dioxide ($SiO_2$) that is at least about 10 μm (e.g., ±8 μm) thick. Additionally, the NCDA layer 226 can have a thickness of at least about 6 μm (e.g., ±4 μm). A combination of the first protective overcoat 212, the second protective overcoat 224 and the NCDA layer 226 are employable to implement the dielectric layer 106 of FIG. 1. In such a situation, the first metal pad 230 and the second metal pad 232 are separated by a distance of about 30 μm (e.g., ±22.8 μm).

The first die 202 and the second die 204 are galvanically isolated and capacitively coupled through the capacitor 240. In this manner, circuits embedded in the first die 202 can communicate with circuits embedded in the second die 204 through the capacitor 240 and vice versa. Because the first die 202 and the second die 204 are galvanically isolated, in some examples, the first die 202 and the second die 204 have grounds at different potentials. In one example of a high voltage application, the ground of the first die 202 has a high voltage difference from the ground of the second die 204 (e.g., a voltage difference of about 40 V or more). In fact, in some examples, such as situations where the first die 202 includes circuits for driving a motor and the second die 204 controls the operations on the first die 202, the ground voltage of the first die 202 may be 1 kV or more greater than the ground voltage of the second die 204.

In some examples, a first recess 242 is etched in the first protective overcoat 212. The first recess 242 in the first protective overcoat 212 exposes a third metal pad 250 positioned on the second surface 214 of the first die 202. The first recess 242 is spaced apart from the NCDA layer 226. Stated differently, in examples where the first recess 242 is included, the first NCDA layer 226 is applied to a portion of the first protective overcoat 212 overlaying the first die 202 that is spaced apart from the first recess 242. Accordingly, the first NCDA layer 226 does not overlay or otherwise cover the first recess 242. A first wire bond 252 is coupled to the third metal pad 250. Additionally, a second substrate 254 (e.g., formed of silicon) contacts the second surface 222 of the second die 204. More particularly, the second surface 222 is proximal to an insulating layer 255 of the second die 204, and the second substrate 254 contacts the insulating layer 255 of the second die 204. A second recess 256 formed with back processing techniques is etched in the second substrate 254 and the insulating layer 255 of the second die 204 to expose a portion of a metal layer within the second die 204 to provide a fourth metal pad 260. Accordingly, in some examples, openings in the second substrate 254 and the insulating layer 255 that form the second recess 256 are self-aligned. Additionally, the insulating layer 255 of the second die 204 separates the fourth metal pad 260 from the second substrate 254. A second wire bond 262 is coupled to the fourth metal pad 260. The first wire bond 252 and the second wire bond 262 can be coupled to other components of the IC package 200, such as other dies and/or external leads of the IC package 200.

The IC package 200 provides a simple design that achieves galvanic isolation. Moreover, in some examples, the IC package 200 achieves basic isolation, and in other examples, the IC package 200 achieves reinforced isolation. Additionally, as noted, in some examples, the first die 202 and the second die 204 embed circuits that have different maximum voltages. Accordingly, wafer materials and processes selected for the particular voltage range and/or other operational parameters of the first die 202 and the second die 204 are employable. In contrast, in situations where the circuits of the first die 202 and the second die 204 are integrated with a single technology, a designer would be limited to using a single type of materials and processing techniques.

Figure 3:
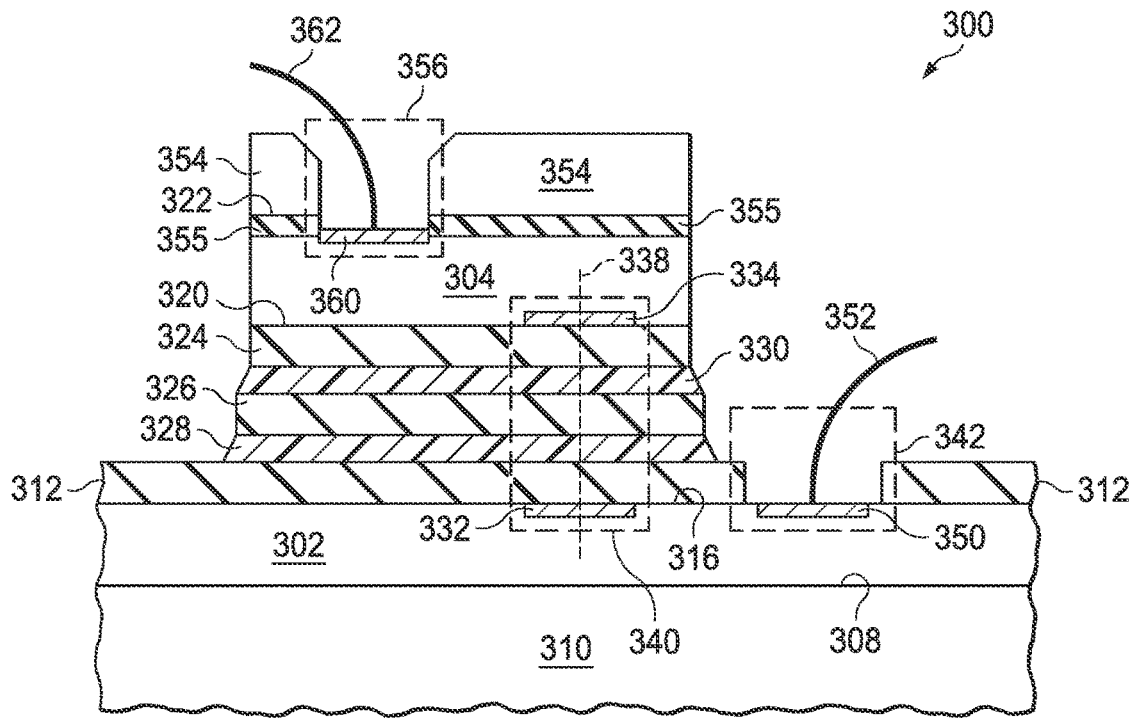
FIG. 3 illustrates yet another example of an IC package with a first die and a second die that are galvanically isolated.

FIG. 3 illustrates a detailed diagram of an IC package 300 in a condition for completing packaging. The IC package 300 can be employed to implement the IC package 100 of FIG. 1. The IC package 300 includes a first die 302 and a second die 304 that are galvanically isolated.

A first surface 308 of the first die 302 overlays a first substrate 310. The first substrate 310 can be silicon. A first protective overcoat 312 is applied to a second surface 316 of the first die 302, and the second surface 316 opposes the first surface 308. In some examples, the second surface 316 of the first die 302 is referred to as a face of the first die 302.

The second die 304 includes a first surface 320 and a second surface 322. The second surface 322 of the second die 304 opposes the first surface 320 of the second die 304. The first surface 320 of the second die 304 is referred to as a face of the second die 304. In some examples, the second die 304 has a smaller footprint than the first die 302. A second protective overcoat 324 is adhered to the first surface 320 of the second die 304.

The first die 302 and the second die 304 include embedded circuits. The first die 302 and the second die 304 can be formed with different materials and/or processing techniques. In this manner, the materials and/or processing techniques for fabricating the first die 302 and the second die 304 are individually selectable based on the operating parameters of the first die 302 and the second die 304.

A spacer plate 326 is sandwiched between the first protective overcoat 312 and the second protective overcoat 324. The spacer plate 326 is formed of a non-conductive material. In some examples, the spacer plate 326 is formed with silicon dioxide ($SiO_2$) materials such as fused silica or quartz.

A first NCDA layer 328 is adhered to the first protective overcoat 312 and the spacer plate 326. Thus, the first NCDA layer 328 is sandwiched between the first protective overcoat 312 and the spacer plate 326. A second NCDA layer 330 is adhered to the second protective overcoat 324. Thus, the second NCDA layer 330 is sandwiched between the second protective overcoat 324 and the spacer plate 326. In some examples, the first NCDA layer 328 and the second NCDA layer 330 is formed with an epoxy.

In some examples, the arrangement of the first die 302 and the second die 304 is referred to as a face-to-face configuration. The first die 302 includes a first metal pad 332 (e.g., a connector) and the second die 304 includes a second metal pad 334. The first metal pad 332 and the second metal pad 334 can each have a diameter of about 120 μm (e.g., ±80 μm). The second die 304 is aligned with the first die 302 such that the first metal pad 332 and the second metal pad 334 are congruent and aligned within manufacture tolerances (e.g., ±10 μm). Accordingly, in one orientation, a plane, such as the plane 338 that extends perpendicular to the second surface 316 of the first die 302 intersects the first metal pad 332 and the second metal pad 334. The first metal pad 332 forms a first node of a capacitor 340 and the second metal pad 334 forms a second node of the capacitor 340. As compared to the IC package 200 of FIG. 2, the IC package 300 has a thinner first protective overcoat 312 and a thinner second protective overcoat 324. The spacer plate 326 compensates for the reduced thickness of the first protective overcoat 312 and the second protective overcoat 324.

The first protective overcoat 312 and the second protective overcoat 324 can each be formed of a stack of materials. For example, the first protective overcoat 312 and the second protective overcoat 324 can be formed with a first layer of silicon dioxide ($SiO_2$) that is at least about 1 μm (e.g., ±0.7 μm) thick and a second layer of silicon oxynitride (SiON) that is at least about 1 μm (e.g., ±0.7 μm) thick. Additionally, the first NCDA layer 328 and the second NCDA layer 330 have a thickness of at least about 6 μm (e.g., ±4 μm) thick. The spacer plate 326 has a thickness of at least about 20 μm (e.g., ±10 μm). A combination of the first protective overcoat 312, the second protective overcoat 324, the first NCDA layer 328, the second NCDA layer 330 and the spacer plate 326 can be employed to implement the dielectric layer 106 of FIG. 1. In such a situation, the first metal pad 332 and the second metal pad 334 are separated by a distance of about 36 μm (e.g., ±20.8 μm).

The first die 302 and the second die 304 are galvanically isolated and capacitively coupled through the capacitor 340. In this manner, circuits embedded in the first die 302 can communicate with circuits embedded in the second die 304 through the capacitor 340 and vice versa. Because the first die 302 and the second die 304 are galvanically isolated, the first die 302 and the second die 304 have different ground potentials. In one example of a high voltage application, the ground of the first die 302 has a high voltage difference from the ground of the second die 304 (e.g., a voltage difference of about 40 V or more). In fact, in some examples, such as situations where the first die 302 includes circuits for driving a motor and the second die 304 controls the operations on the first die 302, the ground voltage of the first die 302 may be 1 kV or more greater than the ground voltage of the second die 304.

In one example, a first recess 342 is etched in the first protective overcoat 312. The first recess 342 in the first protective overcoat 312 exposes a third metal pad 350 positioned on the second surface 316 of the first die 302. The first recess 342 is spaced apart from the first NCDA layer 328. Stated differently, in examples where the first recess 342 is included, the first NCDA layer 328 is applied to a portion of the first protective overcoat 312 overlaying the first die 302 that is spaced apart from the first recess 342. Accordingly, the first NCDA layer 328 does not overlay or otherwise cover the first recess 342. A first wire bond 352 is coupled to the third metal pad 350. Additionally, a second substrate 354 (e.g., formed with silicon), contacts the second surface 322 of the second die 304. More particularly, the second die 304 includes an insulating layer 355 that is proximal to the second surface 322 of the second die 304. Accordingly, the second substrate 354 contacts the insulating layer 355 of the second die 304 in some examples. A second recess 356 etched in the second substrate 354 and the insulating layer 355 of the second die 304 with back-processing techniques exposes a portion of a metal layer of the second die 304 to provide a fourth metal pad 360 within the second die 304. Accordingly, in some examples, openings formed in the second substrate 354 and the insulating layer 355 of the second die 304 that form the second recess 356 are self-aligned. Additionally, the insulating layer 355 of the second die 304 separates the fourth metal pad 360 from the second substrate 354. A second wire bond 362 is coupled to the fourth metal pad 360. The first wire bond 352 and the second wire bond 362 are coupled to other components of the IC package 300, such as other dies and/or external leads of the IC package 300.

The IC package 300 provides a simple design that achieves galvanic isolation. Moreover, in some examples, the IC package 300 achieves basic isolation, and in other examples, the IC package 300 achieves reinforced isolation. Additionally, as noted, in some examples, the first die 302 and the second die 304 embed circuits that have different maximum voltages. Accordingly, wafer materials and processing techniques selected for the particular voltage range and/or other operational properties of the first die 302 and the second die 304 are employable. In contrast, in situations where the circuits of the first die 302 and the second die 304 are integrated on a single die, a designer would be limited to using a single type of materials and processing techniques.

Figure 4:
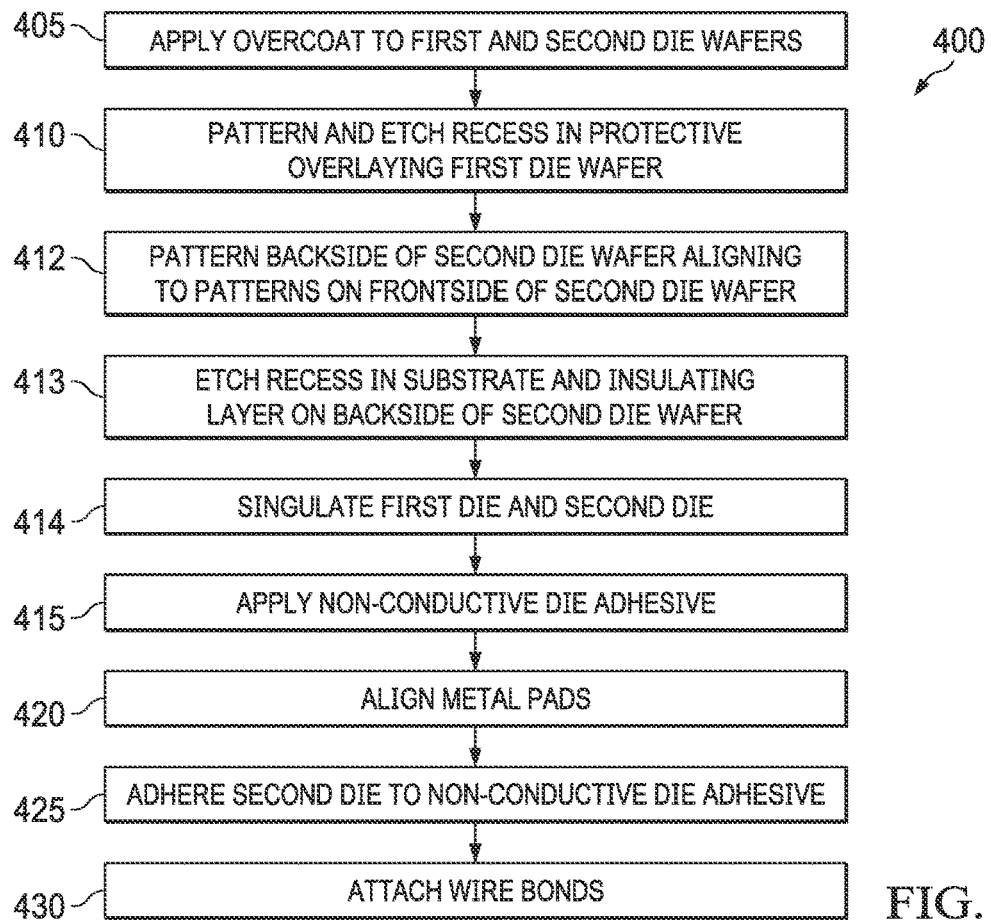
FIG. 4 illustrates a flowchart of an example method of forming an IC package.

FIG. 4 illustrates a method 400 for forming an IC package. The method 400 could be employed for example, to form the IC package 100 of FIG. 1 and/or the IC package 200 of FIG. 2. Thus, the IC package includes a first die and a second die, such as the first die 202 and the second die 204 of FIG. 2. The method 400 is demonstrated with FIGS. 5-8. FIGS. 5-8 illustrate stages of fabrication of the IC package 200 of FIG. 2. Moreover, FIGS. 2 and 5-8 employ the same reference numbers to denote the same structure.

Figure 5:
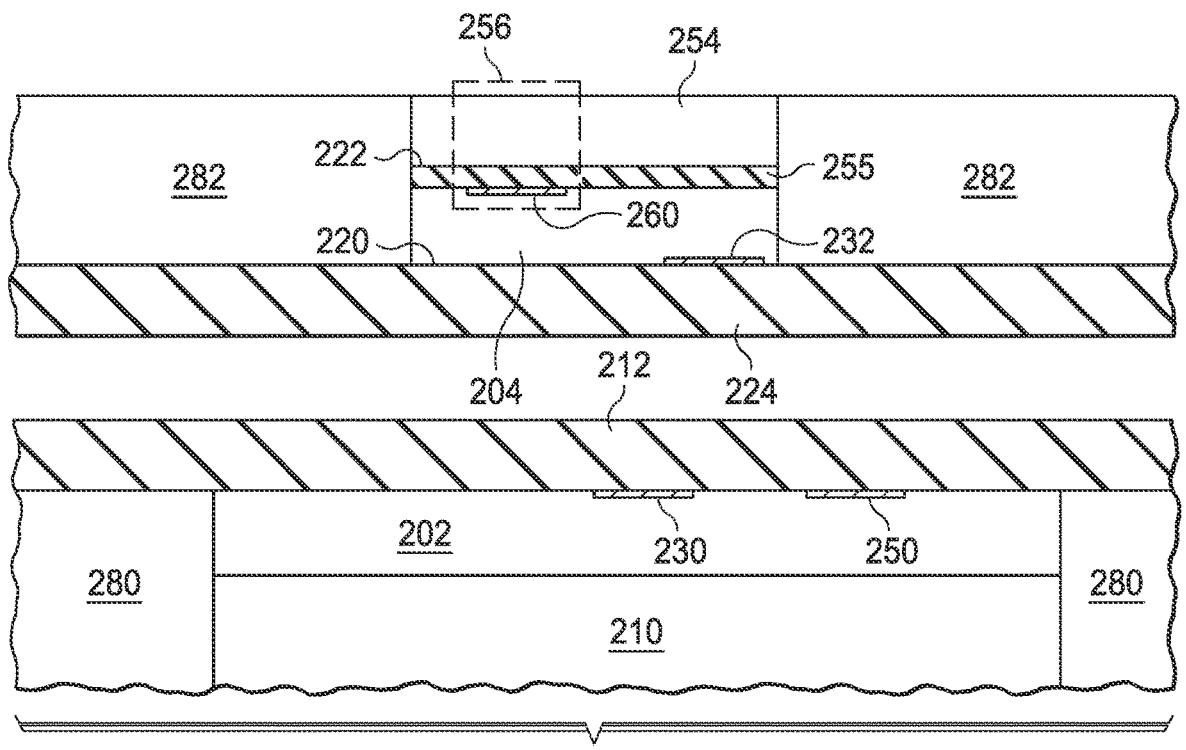
FIG. 5 illustrates a first stage of packaging for the IC package formed by the method of FIG. 4.

At 405, protective overcoats are applied to die wafers that include the first and second die, which can be referred to as a first die wafer and a second die wafer, respectively. More specifically, as illustrated in FIG. 5, a first protective overcoat 212 and a second protective overcoat 224 are applied to a first die wafer 280 that includes the first die 202 and a second die wafer 282 that includes the second die 204, respectively, as illustrated in FIG. 5. Additionally, the first die 202 overlays a first substrate, such as the first substrate 210, as illustrated in FIG. 5.

Figure 6:
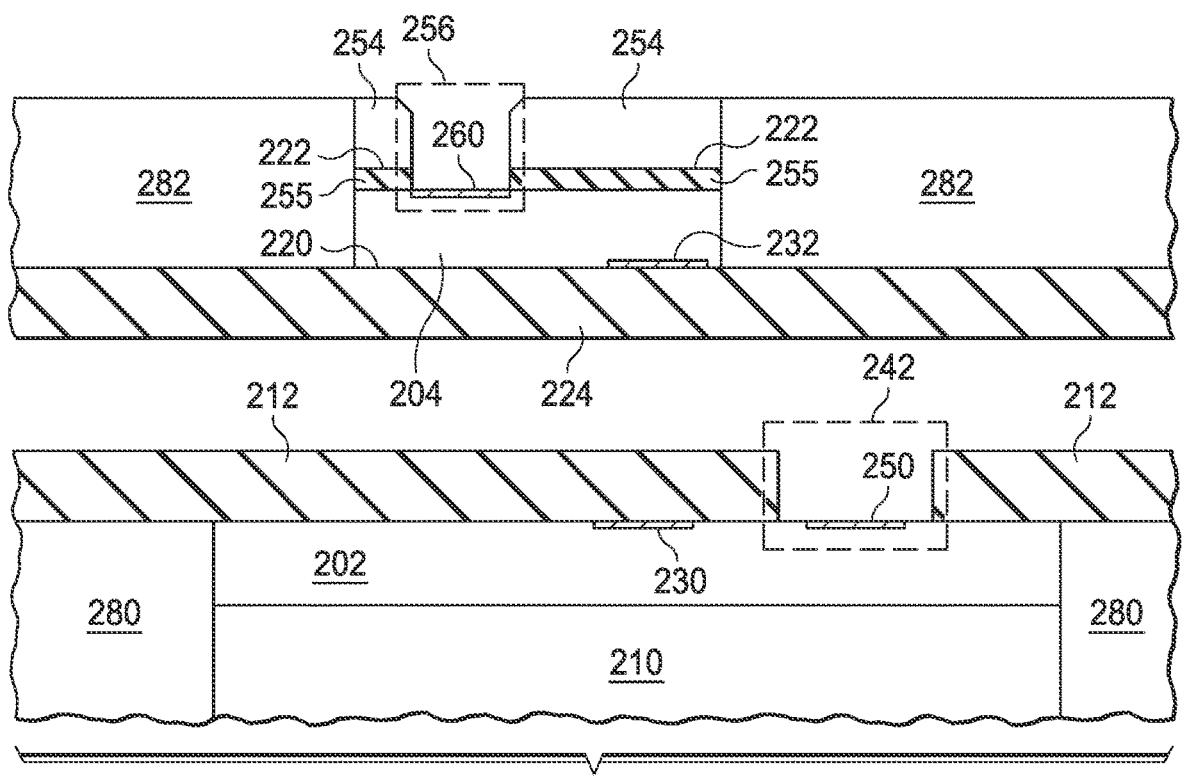
FIG. 6 illustrates a second stage of packaging for the IC package formed by the method of FIG. 4.

Referring back to FIG. 4, at 410, a first recess is patterned and etched in the first protective overcoat applied to the first die wafer. At 412, a backside of the second die wafer is patterned, wherein the pattern on the backside of the second die wafer aligns to patterns on a frontside of the second die wafer. At 413, a second recess is etched in a second substrate and an insulating layer on the backside of the second die wafer at a region overlaying the second die. In some examples, the second recess in the second substrate and the insulating layer is formed with backside processing techniques. As illustrated in FIG. 6, the first recess 242 exposes the third metal pad 250 of the first die 202 and the second recess 256 exposes a portion of a metal layer of the second die 204 to provide the fourth metal pad 260.

Figure 7:
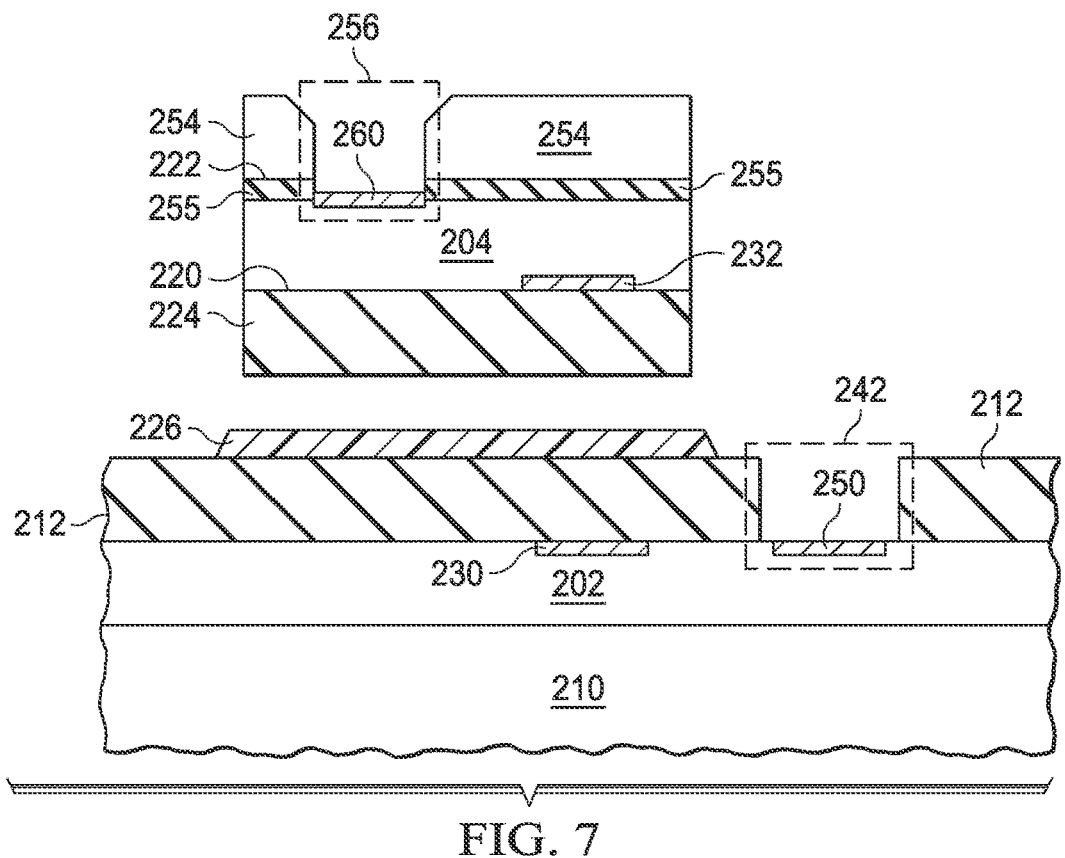
FIG. 7 illustrates a third stage of packaging for the IC package formed by the method of FIG. 4.
Figure 8:
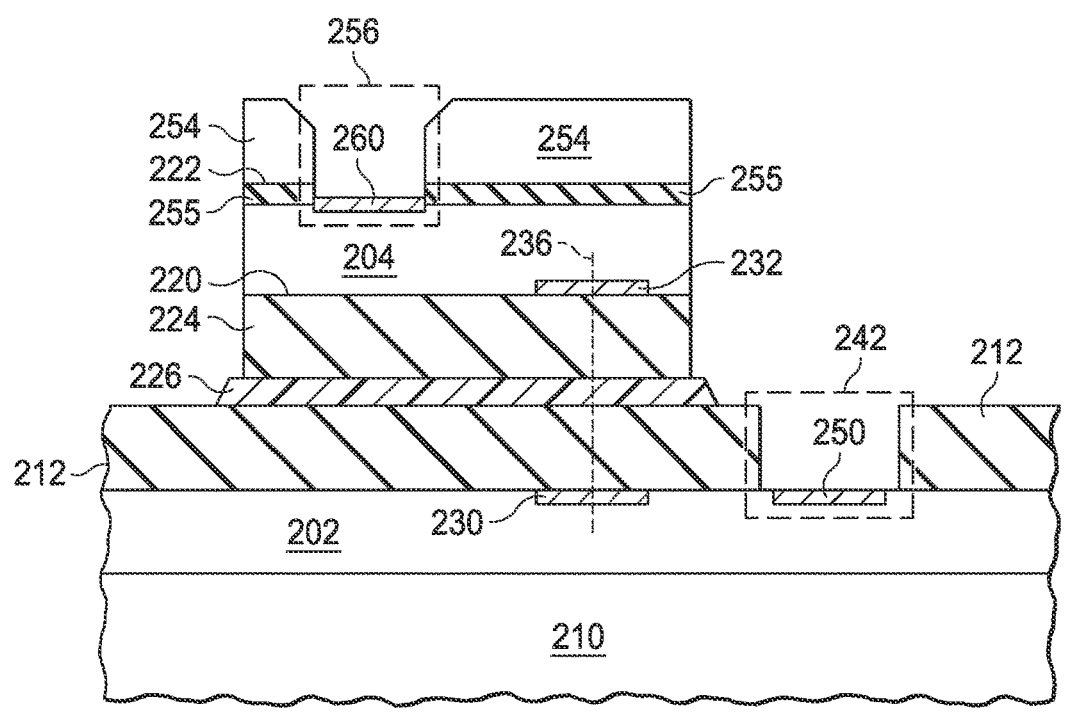
FIG. 8 illustrates a fourth stage of packaging for the IC package formed by the method of FIG. 4.

Referring back to FIG. 4, at 414, the first die and the second die are singulated from the first die wafer and the second die wafer. In some examples, the first die and the second die can be singulated with a lasing process or a cutting process. At 415, an NCDA layer is applied to the first die, as illustrated by the NCDA layer 226 of FIG. 7. As illustrated in FIG. 7, the NCDA layer 226 is applied to a portion of the first protective overcoat 212 of the first die 202 that is spaced apart from the first recess 242. Referring back to FIG. 4, at 420, a first metal pad of the first die and a second metal pad on the second die are aligned and the second die is mounted to the NCDA layer and at 425, the second die is adhered to the NCDA layer. As illustrated in FIG. 8, the second metal pad 232 is aligned with the first metal pad 230, such that the plane 236 extends through the first metal pad 230 and the second metal pad 232 to form a capacitor. Referring back to FIG. 4, at 430, wire bonds are attached to the metal pads exposed by the first and second recesses to form the IC package 200 illustrated in FIG. 2.

Figure 9:
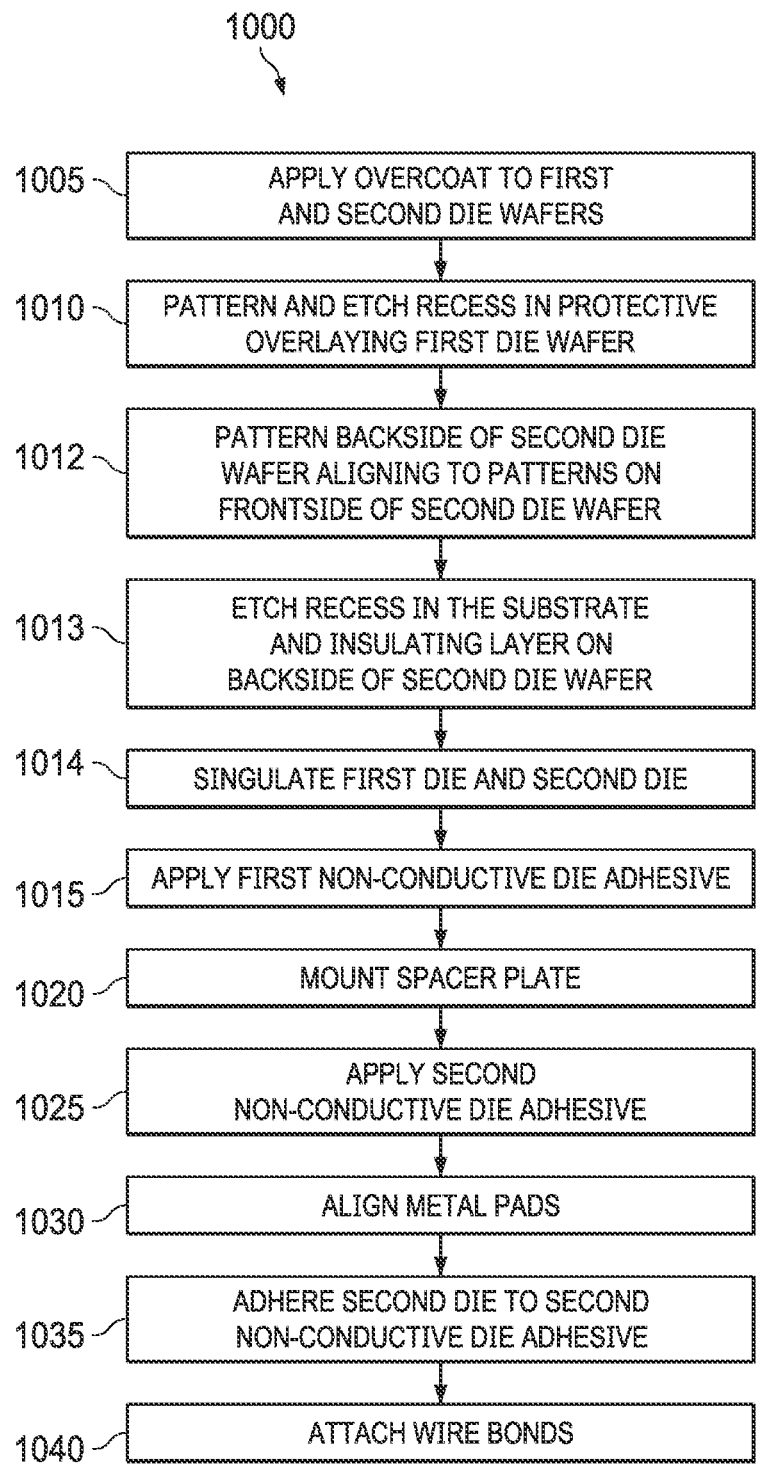
FIG. 9 illustrates a flowchart of another example method of forming an IC package.

FIG. 9 illustrates a method 1000 for forming an IC package. The method 1000 could be employed for example, to form the IC package 100 of FIG. 1 and/or the IC package 300 of FIG. 3. Thus, the IC package includes a first die and a second die, such as the first die 302 and the second die 304 of FIG. 3. The method 1000 is demonstrated with FIGS. 10-14. FIGS. 10-14 illustrate stages of fabrication of the IC package 300 of FIG. 3. Moreover, FIGS. 3 and 10-14 employ the same reference numbers to denote the same structure.

Figure 10:
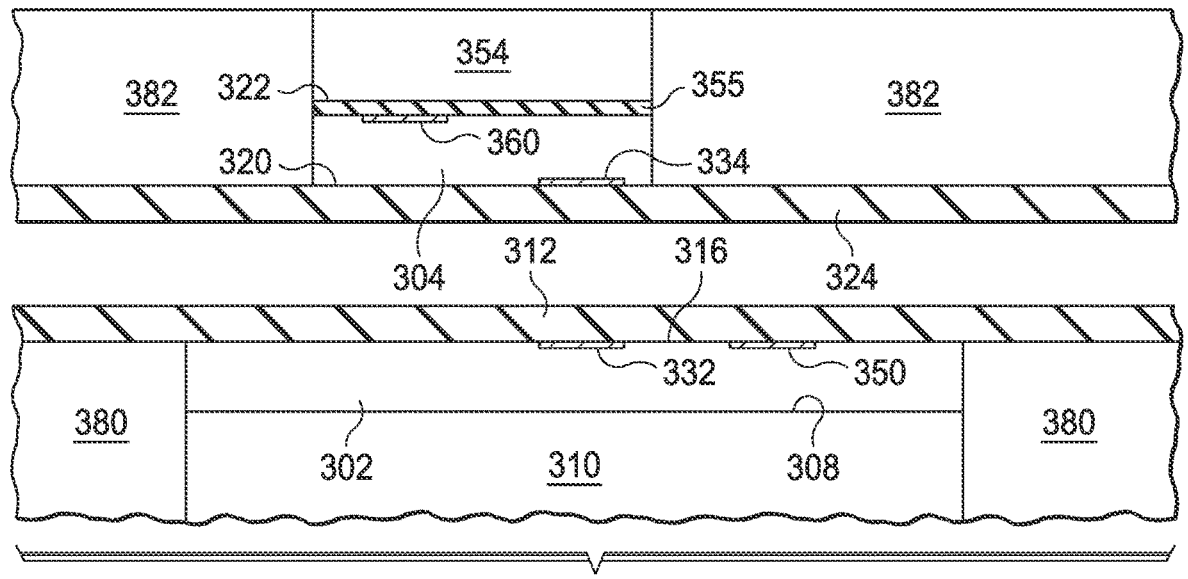
FIG. 10 illustrates a first stage of packaging for the IC package formed by the method of FIG. 9.

At 1005, protective overcoats are applied to die wafers including the first and second die, which can be referred to as a first die wafer and a second die wafer. More specifically, as illustrated in FIG. 10, a first protective overcoat 312 and a second protective overcoat 324 are applied to a first die wafer 380 that includes the first die 302 and a second die wafer 382 that includes the second die 304, respectively. Additionally, as illustrated in FIG. 10, the first die overlays a first substrate 310. Referring back to FIG. 9, at 1010, a first recess is etched in the first protective overcoat applied to the first wafer that includes the first die.

Figure 11:
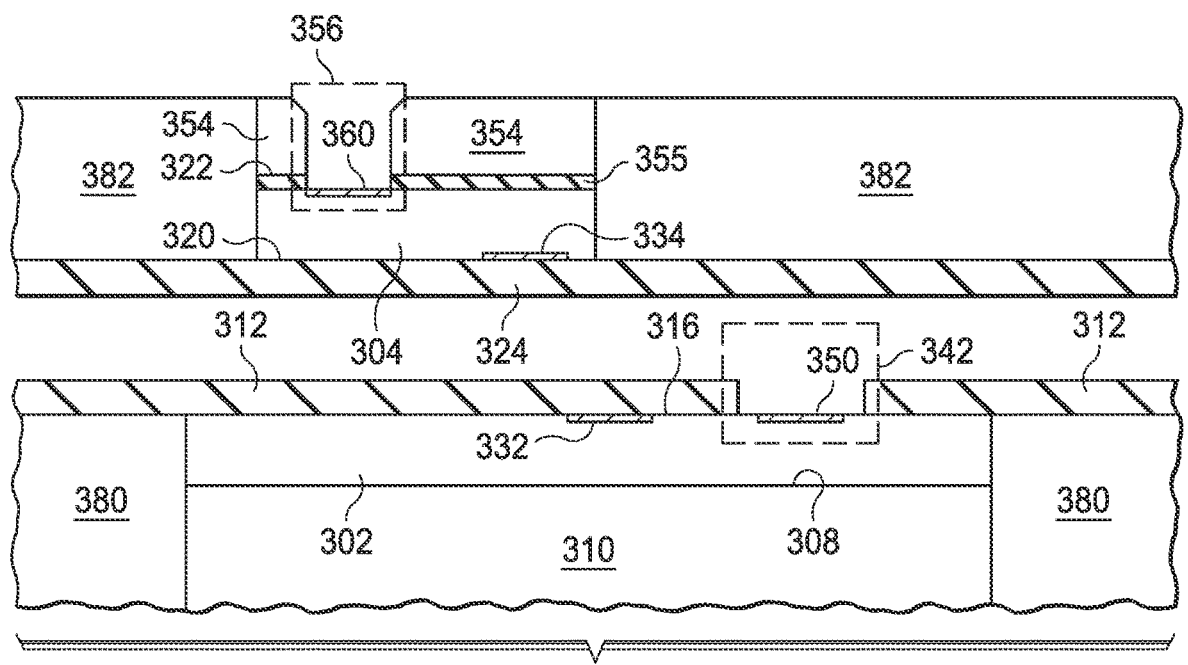
FIG. 11 illustrates a second stage of packaging for the IC package formed by the method of FIG. 9.

At 1012, a backside of the second die wafer is patterned, wherein the pattern on the backside of the second die wafer aligns to patterns on a frontside of the second die wafer 382. At 1013 a second recess is etched in a second substrate and an insulating layer on the backside of the second die wafer in a region overlaying the second die. In some examples, the second recess in the second substrate and insulating layer is formed with backside processing techniques. As illustrated in FIG. 11, the first recess 342 exposes the third metal pad 350 of the first die 302 and the second recess 356 exposes the metal layer of the second die 304 to provide the fourth metal pad 360.

Figure 12:
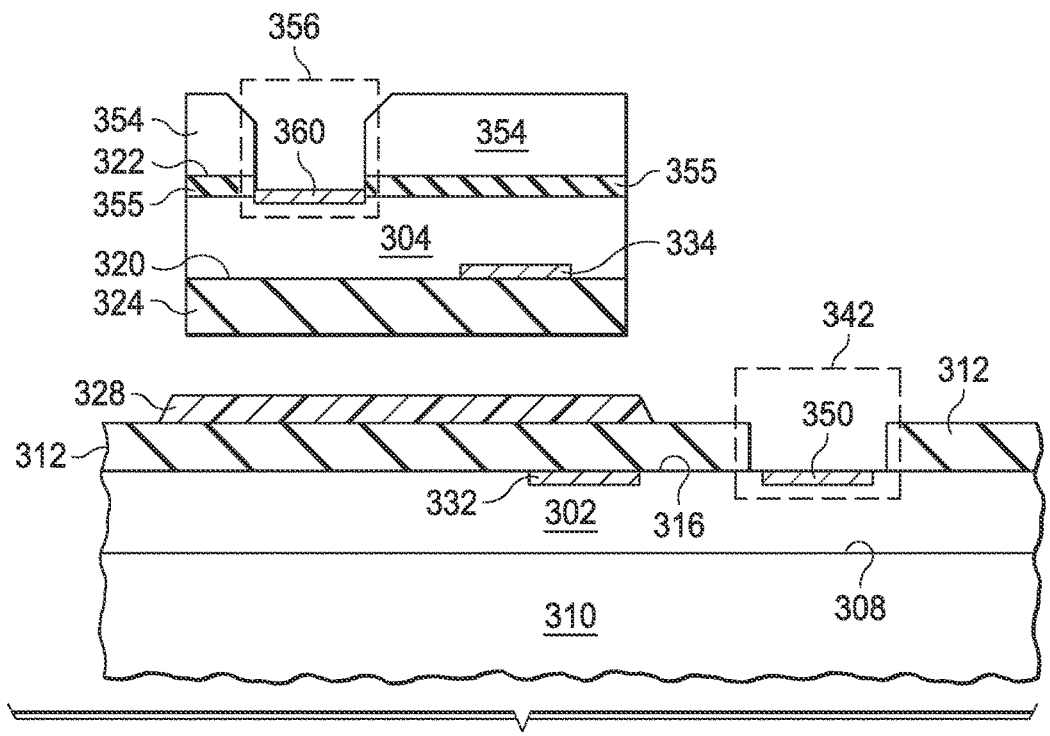
FIG. 12 illustrates a third stage of packaging for the IC package formed by the method of FIG. 9.

Referring back to FIG. 9 at 1014, the first die and the second die are singulated from the first die wafer and the second die wafer, respectively. In some examples, the first die and the second die can be singulated with a lasing process or a cutting process. At 1015, a first NCDA layer is applied to the first die. FIG. 12 illustrates the first NCDA layer 328 applied to the second surface 316 of the first die 302. As illustrated in FIG. 12, the first NCDA layer 328 is applied to a portion of the first protective overcoat 312 of the first die 302 that is spaced apart from the first recess 342.

Figure 13:
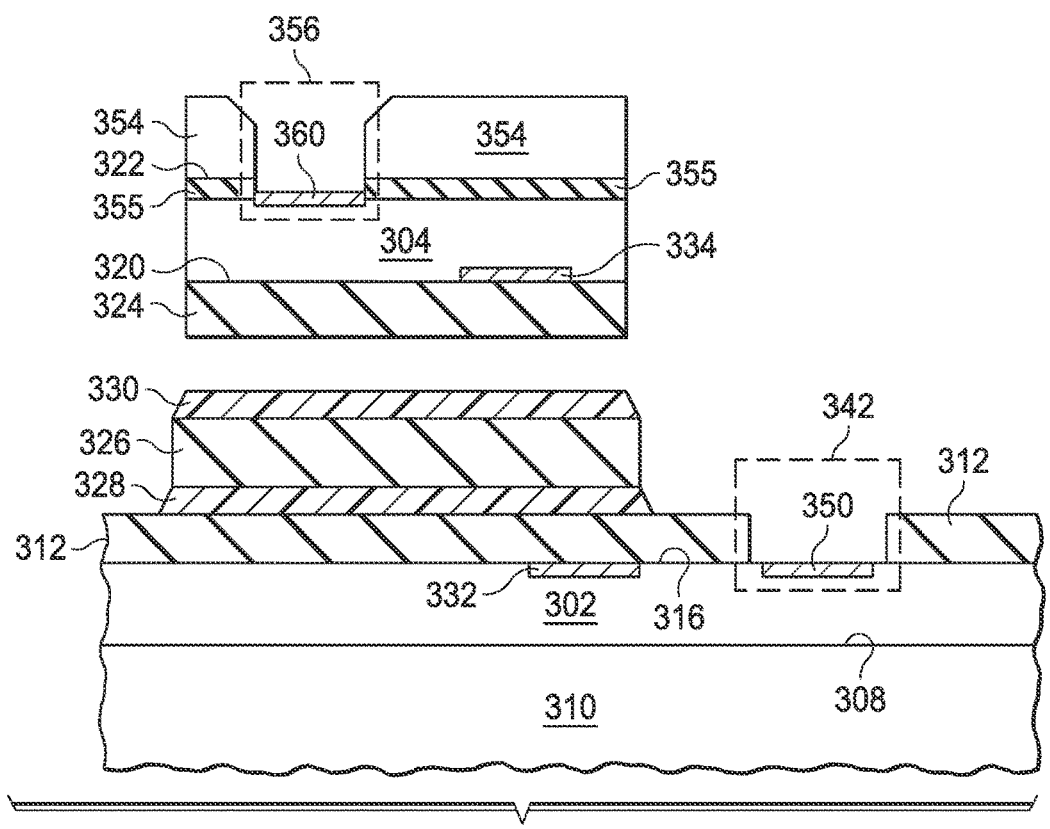
FIG. 13 illustrates a fourth stage of packaging for the IC package formed by the method of FIG. 9.
Figure 14:
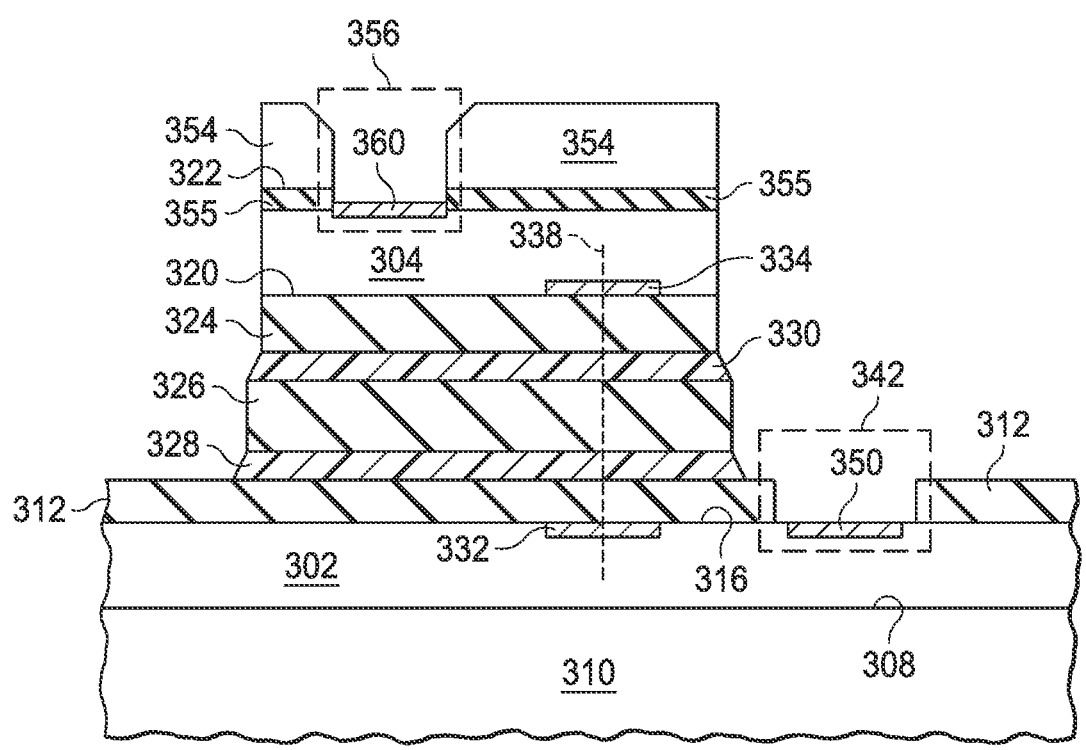
FIG. 14 illustrates a fifth stage of packaging for the IC package formed by the method of FIG. 9.

Referring back to FIG. 9, at 1020, a spacer plate is mounted on the first NCDA layer. At 1025, a second NCDA layer is applied to the spacer plate. FIG. 13 illustrates the spacer plate 326 mounted on the first NCDA layer 328 and the second NCDA layer 330 applied to the spacer plate 326. Referring back to FIG. 9, at 1030, a first metal pad of the first die and a second metal pad of the second die are aligned. At 1035, the second die is mounted to the second NCDA layer. As illustrated in FIG. 14, the second metal pad 334 is aligned with the first metal pad 332, such that the plane 338 extends through the first metal pad 332 and the second metal pad 334 to form a capacitor. Referring back to FIG. 9, at 1040, wire bonds are attached to the metal pads exposed by the first recess 342 and the second recess 356 to form the IC package 300 illustrated in FIG. 3.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims.

What is claimed is:

1. A method, comprising:
   forming a first dielectric layer to a first surface of a first die including a first metal pad at the first surface, the first dielectric layer covering the first metal pad;
   forming a second dielectric layer to a second surface of a second die including a second metal pad at the second surface, the second dielectric layer covering the second metal pad;
   applying a non-conductive die adhesive (NCDA) layer on a portion of the first dielectric layer, the NCDA layer covering the first metal pad; and
   adhering the second die to the first die such that the NCDA layer is positioned between the first and second dielectric layers, wherein the first metal pad is aligned with the second metal pad to form a capacitor including a dielectric layer having the first and second dielectric layers and the NCDA layer, with the first and second metal pads providing respective unitary parallel plates of the capacitor.

2. The method of claim 1, further comprising:
etching a first opening in the first dielectric layer prior to adhering the second die to the first die, wherein the first opening is laterally spaced apart from the NCDA layer and exposes a third metal pad at the first surface.

3. The method of claim 2, further comprising:
attaching a bond wire to the third metal pad after adhering the second die to the first die.

4. The method of claim 1, further comprising:
etching a second opening extending through a substrate facing a third surface of the second die opposite the second surface and an insulating layer of the second die at the third surface prior to adhering the second die to the first die, wherein the second opening overlies the NCDA layer and exposes a fourth metal pad at the third surface.

5. The method of claim 4, further comprising:
attaching a bond wire to the fourth metal pad after adhering the second die to the first die.

6. The method of claim 1, wherein the NCDA layer is a first NCDA layer, the method further comprising:
mounting a spacer plate on the first NCDA layer; and
applying a second NCDA layer on the spacer plate.

7. The method of claim 6, wherein the dielectric layer of the capacitor further includes the spacer plate and the second NCDA layer.

8. The method of claim 6, wherein:
the spacer plate includes a silicon dioxide ($SiO_2$) material; and
the first and second NCDA layers include an epoxy.

9. The method of claim 1, wherein the first and second metal pads are congruent within manufacturing tolerances.

10. The method of claim 1, wherein a plane perpendicular to the first surface of the first die intersects the first metal pad and the second metal pad.

11. The method of claim 1, wherein the first die is galvanically isolated from the second die.

12. The method of claim 1, wherein the first die has a first ground potential and the second die has a second ground potential different from the first ground potential.

13. The method of claim 1, wherein the first die has a first operating voltage and the second die has a second operating voltage different from the first operating voltage.

14. The method of claim 1, wherein the first die includes a first semiconductor material and the second die includes a second semiconductor material different from the first semiconductor material.

15. A method of forming an integrated circuit (IC) package, comprising:
applying a protective overcoat to a first wafer including a first die and a second wafer including a second die, the first die with a first surface facing a substrate and a second surface opposite the first surface, wherein the first die has a first metal pad at the second surface;
singulating the first die from the first wafer and the second die from the second wafer;
applying a non-conductive die adhesive (NCDA) layer to a portion of the protective overcoat on the second surface of the first die;
aligning a second metal pad positioned at a third surface of the second die with the first metal pad, the third surface of the second die facing the second surface of the first die; and
adhering the second die to the first die such that the second surface of the first die faces the third surface of the second die, wherein the first metal pad, the second metal pad, and the NCDA layer disposed between the first and second metal pads form a capacitor that couples the first die to the second die, with the first and second metal pads providing respective unitary parallel plates of the capacitor.

16. The method of forming the IC package of claim 15, further comprising:
etching a first recess in the protective overcoat on the first wafer prior to singulating the first die from the first wafer such that a third metal pad at the second surface of the first die is exposed through the first recess; and
etching a second recess in the second wafer prior to singulating the second die from the second wafer, the second recess extending through a second substrate facing a fourth surface of the second die opposite the third surface and an insulating layer of the second die at the fourth surface such that a fourth metal pad at the fourth surface is exposed through the second recess.

17. The method of forming the IC package of claim 16, wherein the insulating layer separates the fourth metal pad from the second substrate.

18. The method of forming the IC package of claim 16, wherein the first recess is laterally spaced apart from the NCDA layer.

19. The method of forming the IC package of claim 16, further comprising:
attaching a first wire bond to the third metal pad; and
attaching a second wire bond to the fourth metal pad.

20. The method of forming the IC package of claim 15, wherein the capacitor includes a dielectric layer having the protective overcoat on the second surface of the first die, the protective overcoat on the third surface of the second die, and the NCDA layer disposed therebetween.

* * * * *